United States Patent
Lin et al.

(10) Patent No.: US 11,569,062 B2
(45) Date of Patent: Jan. 31, 2023

(54) GAS DELIVERY SYSTEM FOR ION IMPLANTER

(71) Applicant: Taiwan Semiconductor Manufacturing Co., Ltd., Hsinchu (TW)

(72) Inventors: Hom-Chung Lin, Hsinchu (TW); Jih-Churng Twu, Hsinchu (TW); Yi-Ting Chang, Hsinchu (TW); Chao-Po Lu, Hsinchu (TW); Tsung-Min Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/882,053

(22) Filed: May 22, 2020

(65) Prior Publication Data

US 2021/0366690 A1    Nov. 25, 2021

(51) Int. Cl.
*H01J 37/31* (2006.01)
*H01J 37/317* (2006.01)
*H01J 37/08* (2006.01)
*H01J 37/32* (2006.01)

(52) U.S. Cl.
CPC .......... *H01J 37/3171* (2013.01); *H01J 37/08* (2013.01); *H01J 37/3244* (2013.01); *H01J 2237/006* (2013.01)

(58) Field of Classification Search
USPC .................................................. 250/492.21
See application file for complete search history.

(56) References Cited

U.S. PATENT DOCUMENTS

| | | | |
|---|---|---|---|
| 6,180,954 B1 | 1/2001 | Verrier et al. | |
| 6,515,290 B1 * | 2/2003 | Rzeszut | H01J 37/08 250/492.21 |
| 8,558,192 B2 * | 10/2013 | Ward | H01J 37/08 250/424 |
| 9,212,785 B2 * | 12/2015 | Chaney | H05F 3/00 |
| 11,004,709 B2 | 5/2021 | Hsieh et al. | |
| 2005/0005957 A1 | 1/2005 | Yamagata et al. | |

(Continued)

FOREIGN PATENT DOCUMENTS

| | | |
|---|---|---|
| CN | 1118655 C | 8/2003 |
| CN | 110890259 A | 3/2020 |
| KR | 10-2003-0029915 A | 4/2003 |

(Continued)

*Primary Examiner* — Wyatt A Stoffa
(74) *Attorney, Agent, or Firm* — Seed IP Law Group LLP

(57) ABSTRACT

An ion implantation system includes an ion implanter containing an ion source unit and a dopant source gas supply system. The system includes a dopant source gas storage tank inside a gas box container located remotely to the ion implanter and a dopant source gas supply pipe configured to supply a dopant source gas from the dopant source gas storage tank to the ion source unit. The dopant source gas supply pipe includes an inner pipe, an outer pipe enclosing the inner pipe, a first pipe adaptor coupled to first end of respective inner and outer pipes, and a second pipe adaptor coupled to seconds end of respective inner and outer pipes opposite the first end. The first pipe adaptor connects the inner pipe to the dopant source gas storage tank and the second pipe adaptor connects the inner pipe to the ion source unit.

20 Claims, 4 Drawing Sheets

(56) References Cited

U.S. PATENT DOCUMENTS

2010/0033096 A1\* 2/2010 Choi .................. H01J 37/3244
315/111.21

FOREIGN PATENT DOCUMENTS

| KR | 10-2013-0124338 A | 11/2013 |
|----|-------------------|---------|
| TW | 201923941 A | 6/2019 |
| WO | 02/21566 A2 | 3/2002 |
| WO | 2012/074889 A2 | 6/2012 |

\* cited by examiner

GAS DELIVERY SYSTEM FOR ION IMPLANTER

BACKGROUND

Ion implantation is a process for introducing chemical species into a substrate by direct bombardment of the substrate with energized ions. In semiconductor manufacturing, ion implantation is commonly used to introduce dopants into a semiconductor wafer to modify electronic properties of the semiconductor wafer. Ion implantation is carried out in an ion implanter. An ion implanter includes an ion source unit for generating positively charged ion species. These ion species are extracted from the ion source unit by a high voltage extraction potential and are then filtered to obtain the desired ion specie, i.e., ion species to be impinged into a target, e.g., a target region on a semiconductor wafer. The desired ion species are further accelerated and directed to the target for implanting.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
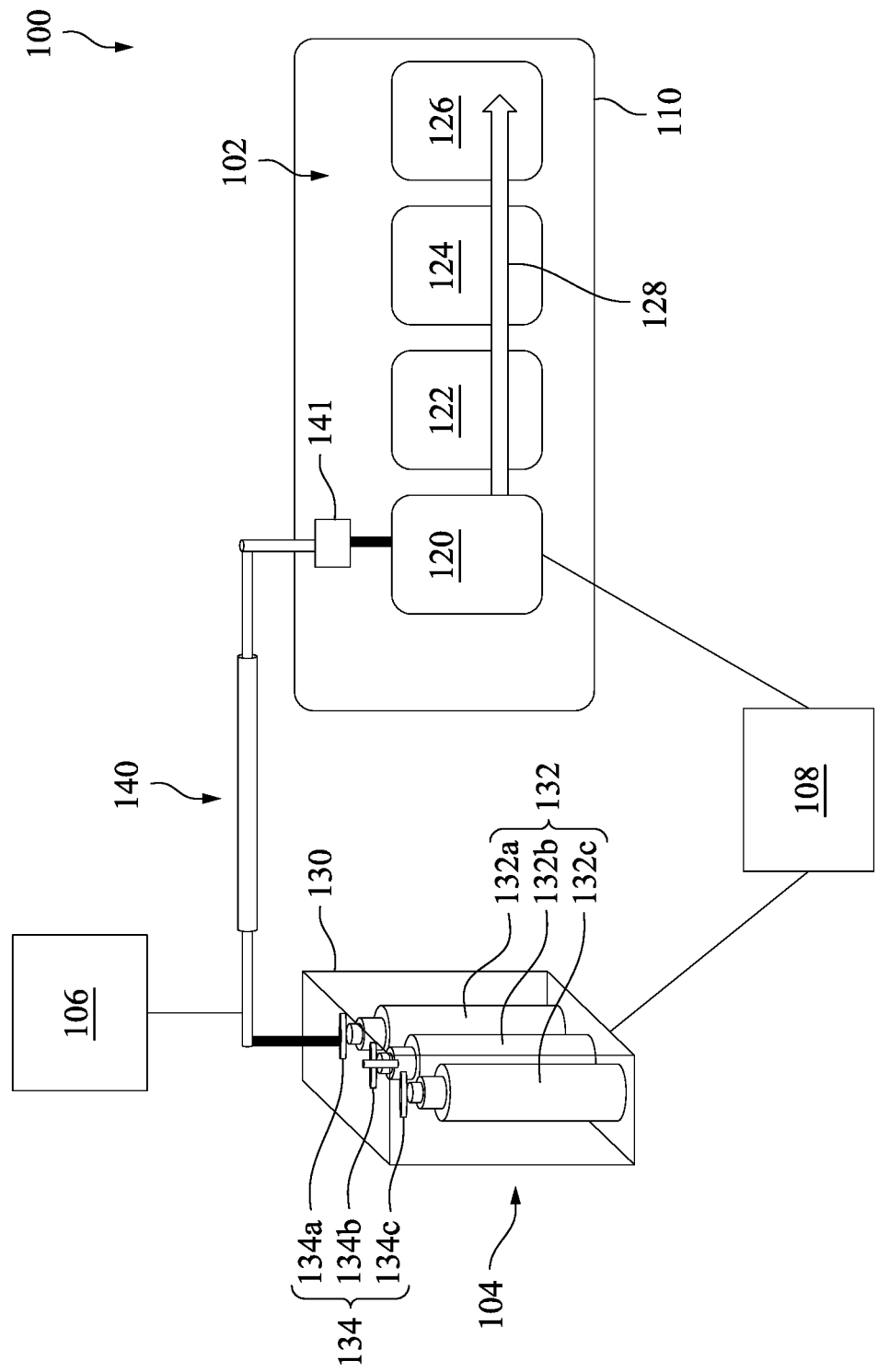
FIG. 1 is a schematic diagram of an ion implantation system, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typical dopant species used in ion implantation for fabricating silicon-based integrated circuits include boron as a p-type dopant, and phosphorus or arsenic as an n-type dopant. Dopant species are generated from dopant source gases, such as boron trifluoride ($BF_3$), phosphine ($PH_3$), and arsine ($AsH_3$). These dopant source gases are highly toxic, and to prevent factory personnel from being endangered by these toxic gases, gas cylinders for supply of dopant source gases are typically placed inside a gas box. The gas box is disposed inside a housing where the ion implanter is located. The gas box is an enclosure connected to and at the same high voltage as the ion source unit when the ion implanter is in operation.

Small-sized gas cylinders have to be used to accommodate the limited space inside the housing of the ion implanter. The gas cylinders containing the toxic/hazardous dopant source gases have to be frequently changed out and replaced by fresh cylinders charged with the dopant source gases. To carry out such change-out of gas cylinders located inside the gas box, technicians must wear self-contained breathing apparatus (SCBA) units, physically remove the exhausted gas cylinders from the gas box and install fresh gas cylinders in the gas box. Significant safety issues in handling of these dopant source gas cylinders are thus raised.

In addition to the dangers associated with such change-out of gas cylinders inside the housing of the ion implanter, it is also a common occurrence that the gas cylinders become exhausted during production operations, so that the ion implantation system must be shut down in order to carry out the change-out gas cylinders. Such unscheduled shutdown of the ion implanter can cause expensive reworking of partially processed wafers, and in some cases the wafer products may be deficient or even useless for their intended purpose, as a consequence of the interruption of their processing.

In embodiments of the present disclosure, an ion implantation system including a dopant source gas supply system configured to supply one or more dopant source gases to an ion implanter from a location remote of the ion implanter is provided. Placing the dopant source gas supply system outside of a housing within which the ion implanter is placed helps to reduce the footprint of the ion implanter. In addition, placing the dopant source gas supply system outside of the housing within which the ion implanter is placed allows to use larger size gas storage tanks, which reduces the frequency of changing the empty gas tanks where the gases are consumed. As a result, the operational efficiency of the ion implantation system are enhanced. The ion implantation system further includes a monitoring system configured to in situ monitor the leakage of the dopant source gases from the dopant source gas supply pipes adapted to couple the dopant source gas storage tanks to the ion source unit. The ion implantation system, thus, provides an enhanced safety in the event of leakage of the dopant source gases.

FIG. 1 is a schematic diagram of an ion implantation system 100, in accordance with some embodiments. Referring to FIG. 1, the ion implantation system 100 includes an ion implanter 102 configured to perform ion implantation processes on a semiconductor wafer, a dopant source gas supply system 104 configured to supply one or more dopant source gases to the ion implanter 102, a monitoring system 106 configured to in situ monitor the leakage of a dopant source gas during ion implantation processes. The ion implantation system 100 is communicatively coupled with a control unit 108. Components of the ion implantation system 100 receive control signals from the control unit 108 and perform various operations based on the control signals received.

The ion implanter 102 is disposed inside a housing 110. In some embodiments, the ion implanter 102 includes an ion source unit 120, a mass analyzer unit 122, an ion acceleration unit 124, and an end station 126. The ion implanter 102 is configured to generate an ion beam 128, transmit the ion beam 128 toward the end station 126, and imping the ion beam 128 on a workpiece, for example, a semiconductor wafer, in the end station 126.

The ion source unit 120 is configured to ionize a dopant source gas to form ions. The ion source unit 120 generates ions by introducing electrons into a vacuum arc chamber filled with the dopant source gas. Collisions of the electrons with atoms and molecules in the dopant source gas result in the creation of an ionized plasma consisting of positive and negative ions. The generated ions are extracted out of the ion source unit 120 by applying a high voltage to form the ion beam 128. To generate the ion beam 128, the ion source unit 120 is maintained at a high positive potential to generate ions and extract the generated ions. In some embodiments, the ion source unit 120 resides at an electrical potential, for example, from about 5 kV up to about 250 kV, relative to the ground potential. In some embodiments, the ion source unit 120 resides at an electrical potential of 90 kV relative to the ground potential.

The mass analyzer unit 122 is positioned along the beam path between the ion source unit 120 and the end station 126. The mass analyzer unit 122 has a curved internal passage and one or more magnets arranged along the internal passage of the mass analyzer unit 122. As the ion beam 128 enters the internal passage of the mass analyzer unit 220, the ion beam 128 is bent by the magnetic field of the magnets. As a result, ions in the ion beam 128 that have a charge-to-mass ratio outside of a predetermined range are deflected into sidewalls of the internal passage, while the selected ions in the ion beam 128 which have a charge-to-mass ratio within the predetermined range are allowed to exit the mass analyzer unit 122.

The ion accelerator unit 124 is configured to apply an accelerating voltage to the ion beam 128 after the ion beam 128 exits the mass analyzer unit 122, thereby bringing the ion beam 128 to a desired implantation energy before the ion beam 128 reaches the end station 126. In embodiments, the accelerating voltage is adjusted in a range from about 50 kV to about 250 kV.

The end station 126 is located at the end of the beam path. The end station 126 is configured to receive the ion beam 128 and direct the ion beam 128 toward a semiconductor wafer. In some embodiments, the end station 126 includes a chuck (not shown) for holding the semiconductor wafer thereon, and an actuator (not shown) for moving the chuck, with the semiconductor wafer held thereon, in one or more directions. The movements of the chuck are configured so that the ion beam 128 impinges in a uniform manner on the semiconductor wafer. In some embodiments, the end station 126 includes a load lock for transferring the semiconductor wafer into or out of the ion implanter 102, and a robot arm for transferring the semiconductor wafer between the chuck and the load lock. In some embodiments, the end station 126 further includes a measuring device for measuring one or more properties of the ion beam 128 to be impinged on the semiconductor wafer, thereby providing feedback information for adjusting the ion beam 128 in accordance with a processing recipe to be applied to the semiconductor wafer. Examples of measured ion beam properties include, but are not limited to, beam profile, beam energy and beam current.

The dopant source gas supply system 104 is operable to supply different types of dopant source gases to the ion source unit 120 of the ion implanter 102 in a parallel type fashion to facilitate an easy change between dopant source gases (e.g., to allow an easy change from an n-type dopant to a p-type dopant). For example, for an n-type dopant, a gaseous hydride such as arsine ($AsH_3$) or phosphine ($PH_3$) is commonly used as a dopant source gas, while for a p-type dopant, a gaseous fluoride such as boron difluoride is commonly used as a dopant source gas. All these dopant source gases are toxic and corrosive and require appropriate handling.

In some embodiments, the dopant source gas supply system 104 originates at a source located remotely from the ion implanter 102. In some embodiments, the source is a sealed gas box container 130 that houses a plurality of dopant source gas storage tanks 132. The dopant source gas storage tanks 132 are adapted to store and supply different types of dopant source gases to the ion source unit 120 of the ion implanter 102. The gas box container 130 and the dopant source gas storage tanks 132 disposed therein are maintained at a ground potential (e.g., 0 V) or a low potential during operation of the ion implantation system 100 for the safety of factory personnel.

In some embodiments, the dopant source gas storage tanks 132 includes a first dopant source gas storage tank 132a adapted to supply a first dopant source gas to the ion source unit 120 of the ion implanter 102, a second dopant source gas storage tank 132b adapted to supply a second dopant source gas to the ion source unit 120 of the ion implanter 102, and a third dopant source gas storage tank 132c adapted to supply a third dopant source gas to the ion source unit 120 of the ion implanter 102. It should be noted that although the dopant source gas supply system 104 of FIG. 1 illustrates a system which provides for the delivery of three (3) different types of dopant source gases, systems which provide for more or fewer dopant source gases are contemplated. In some embodiments, the first dopant source gas is an arsenic-containing gas such as $AsH_3$, the second dopant source gas is a phosphorous-containing gas such as $PH_3$, and the third dopant source gas is a boron-containing gas such as $BF_3$.

Shut-off valves 134 are coupled to respective dopant source gas storage tanks 132 (e.g., 132a, 132b, 132c) to control the supply of the dopant source gases from respective dopant source gas storage tanks 132 (e.g., 132a, 132b, 132c) to the ion source unit 120 of the ion implanter 102. For example, in some embodiments, a first shut-off valve 134a is coupled to the first dopant source gas storage tank 132a to control the supply of the first dopant source gas from the first dopant source gas storage tank 132a to the ion source unit 120 of the ion implanter 102, a second shut-off valve 134b is coupled to the second dopant source gas storage tank 132b to control the supply of the second dopant source gas from the second dopant source gas storage tank 132b to the ion source unit 120 of the ion implanter 102, and a third shut-off valve 134c is coupled to the third dopant source gas storage tank 132c to control the supply of the third dopant source gas from the third dopant source gas storage tank 132c to the ion source unit 120 of the ion implanter 102. Each of the shut-off valves 134 (e.g., 134a, 134b and 134c) is normally closed and is opened when a corresponding dopant source gas is supplied to the ion source unit 120 of the ion implanter 102 when the ion implantation system 100 is in operation.

The dopant source gas supply system 104 further includes a plurality of dopant source gas supply pipes 140 for carrying the dopant source gas from respective dopant source gas storage tanks 132 (e.g., 132a, 132b and 132c) to the ion source unit 120. Because each of the dopant source gas supply pipes 140 has a similar configuration and operates in a similar manner, only one dopant source gas supply pipe 140 that couples the dopant source gas storage tank 132a to the ion source unit 120 is illustrated in FIG. 1 for purposes of simplicity and brevity. In some embodiments, the dopant source gas supply pipe 140 starts at the outside of the gas box container 130 and terminates at a control box 141 placed inside the housing 110. In some embodiments, the control box 141 includes a mass flow controller (not shown) operative to control the amount of dopant source gas flowing into the ion source unit 120 of the ion implanter 102. The dopant source gas supply pipe 140 thus extends across a potential difference between the gas box container 130 and the ion source unit 120 of the ion implanter 102. In some embodiments, a 90 kV potential difference exists between the opposite ends of the dopant source gas supply pipe 140.

Figure 2B:
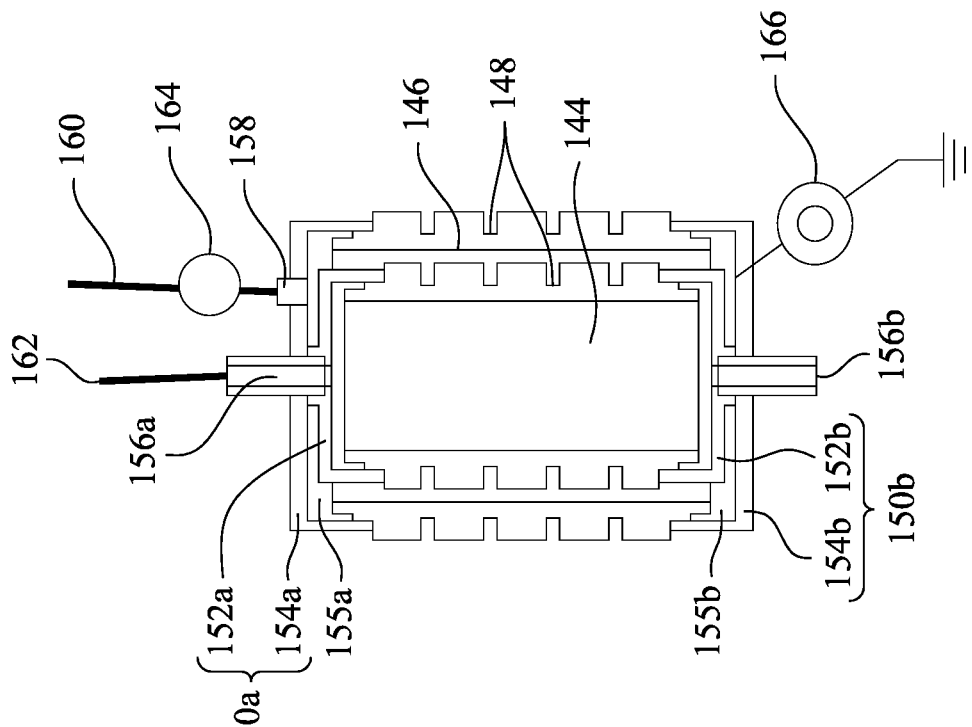
FIG. 2B is a cross-sectional view of the dopant source supply pipe of FIG. 2A taken along the line B-B'.
Figure 2A:
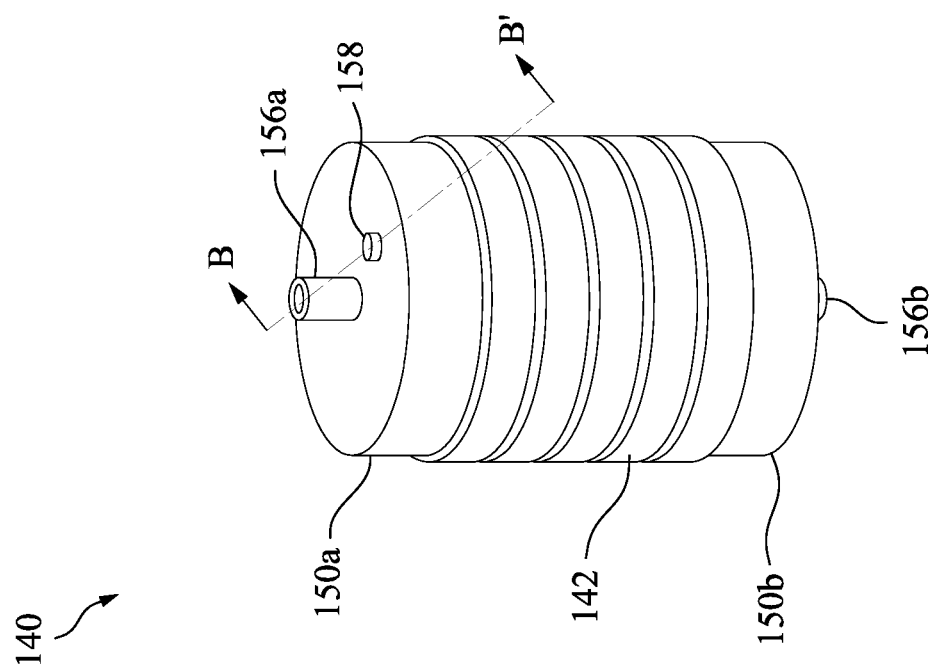
FIG. 2A is a perspective view of a dopant source gas supply pipe used in a dopant source gas supply system in the ion implantation system, in accordance with some embodiments.

FIGS. 2A and 2B illustrates a dopant source gas supply pipe 140 of FIG. 1. FIG. 2A is a perspective view of the dopant source gas supply pipe 140, in accordance with some embodiments. FIG. 2B is a cross-sectional view of the dopant source gas supply pipe 140 of FIG. 2A taken along the line B-B'. Referring to FIGS. 2A and 2B, in some embodiments, the dopant source gas supply pipe 140 includes a pipe body 142 and pipe adaptors (150a, 150b) coupled to opposite ends of the pipe body 142.

In some embodiments, the pipe body 142 has a double walled pipe structure. The pipe body 142 includes two separate pipes in which an inner pipe 144 carries the dopant source gas from a dopant source gas storage tank 132 (e.g., 132a, 132b or 132c) and an outer pipe 146 carries an inert gas such as nitrogen or argon. The outer pipe 146 surrounds the inner pipe 144 and has a diameter greater than that of the inner pipe 144. In some embodiments, the inner pipe 144 and the outer pipe 146 have a circular shape. However, it should be noted that any shapes of the inner pipe 144 and the outer pipe 146 such as hexagonal shape and oval shape are contemplated.

In some embodiments, the outer pipe 146 is filled with an inert gas with a predetermined pressure and the pressure change of the inert gas inside the outer pipe 146 is monitored. Consequently, leakage of the dopant source gas supply pipe 140 is able to be detected when the pressure change of the inert gas in the outer pipe 146 falls below a predetermined threshold. Furthermore, the pressure of the inter gas in the outer pipe 146 is maintained to be higher than the pressure of the dopant source gas in the inner pipe 144. Consequently, if any leakage associated with the inner pipe 144 occurs, the dopant source gas will be contained within the inner pipe 144. The outer pipe 146 thus provides a safe containment in the event the inner pipe 144 experiences the leakage.

The dopant source gas is transferred via the dopant source gas supply pipe 140 to the ion source unit 120 when the ion implantation system 100 is in operation. Within the housing 110 of the ion implanter 102, the dopant source gas is steppe up from the ground potential to a potential at which the ion source unit 120 operates. In some embodiments, the ion source unit 120 operates at 90 kV. Consequently, the dopant source gas supply pipe 140 has to across a potential difference in order to carry a dopant source gas from a dopant source gas storage tank 132 (e.g., 132a, 132b or 132c) to the ion source unit 120. To insulate the ion source unit 120 from the electrical ground of the gas box container 130, the inner pipe 144 and the outer pipe 146 of the pipe body 142 are made of an electrically insulating material, such as, for example, polytetrafluoroethylene (PTFE), polypropylene (PP), polyethylene (PE), polyvinyl chloride (PVC), or a ceramic material such as aluminum oxide. The insulating pipe material helps to maintain the potential difference between the dopant source gas storage tank 132 (e.g., 132a, 132b or 132c) and the ion source unit 120 during operation of the ion implantation system 100.

In some embodiments, in order to provide the pipe body 142 with a sufficient mechanical strength, grooves 148 are formed on the outer surface of each of the inner pipe 144 and the outer pipe 146 of the pipe body 142. In some embodiments, the grooves 148 are formed along the outer circumference of each of the inner pipe 144 and the outer pipe 146 of the pipe body 142.

The first pipe adaptor 150a and the second pipe adaptor 150b are coupled to front and rear ends of the pipe body 142, respectively. The first pipe adaptor 150a is configured to seal the front end of the pipe body 142 and to connect the front end of the pipe body 142 to a dopant gas storage tank 132 (e.g., 132a, 132b or 132c). In some embodiments, the first pipe adaptor 150a includes an inner cap 152a configured to couple to the front end of the inner pipe 144 of the pipe body 142 and an outer cap 154a configured to couple to the front end of the outer pipe 146 of the pipe body 142. A gap 155a is between the inner cap 152a and the outer cap 154a. In some embodiments, the first pipe adaptor 150a further includes an inlet port 156a extending through the outer cap 154a and the inner cap 152a to be in fluidic communication with the inner pipe 144 of the pipe body 142. The inlet port 156a is configured to allow a dopant source gas from a dopant source gas storage tank 132 (e.g., 132a, 132b or 132c) to flow into the inner pipe 144 of the pipe body 142. The first pipe adaptor 150a further includes an inlet port 158 extending through the outer cap 154a to be in fluidic communication with the outer pipe 146 of the pipe body 142. The inlet port 158 is configured to allow an inert gas to be pumped into the outer pipe 146 of the pipe body 142 via, for example, an inert gas line 160.

The second pipe adaptor 150b is configured to seal the rear end of the pipe body 142 and to connect the rear end of the pipe body 142 to the ion source unit 120 of the ion implanter 102. In some embodiments, the second pipe adaptor 150b includes an inner cap 152b configured to couple to the rear end of the inner pipe 144 of the pipe body 142 and an outer cap 154b configured to couple to the rear end of the outer pipe 146 of the pipe body 142. A gap 155b is between the inner cap 152b and the outer cap 154b. In some embodiments, the second pipe adaptor 150b includes an outlet port 156b that extends through the outer cap 154b and the inner cap 124b to be in fluidic communication with the inner pipe 144 of the pipe body 142. The outlet port 156b is configured to allow the dopant source gas flowed into the inner pipe 144 of the pipe body 142 to flow out of the dopant source gas supply pipe 140 and into the ion source unit 120 of the ion implanter 102.

The second pipe adaptor 150b is maintained at a higher potential than the first pipe adaptor 150a because the second pipe adaptor 150b is connected to an electrically conductive gas transport line 162 being coupled to the ion source unit 120 of the ion implanter 102. In some embodiments, the first pipe adaptor 150a and the second pipe adaptor 150b are made of an electrically conductive material such as, for example stainless steel.

The monitoring system 106 is configured to in situ monitor the leakage of the dopant source gas supply pipe 140. In some embodiments, the monitoring system 106 includes a pressure sensor 164 that is fluidically coupled to the inert gas line 160. The pressure sensor 164 is operative to detect the pressure level of the inert gas contained in the outer pipe 146 of the dopant source gas supply pipe 140 at any point during operation of the ion implantation system 100. By monitoring a pressure level of the inter gas in the outer pipe 146, leakage is detected if the pressure of the inert gas decreases, for example, if the pressure of the inert gas falls below a predetermined threshold. Upon the detection of the inert gas pressure falls below the predetermined threshold, the control unit 108 sends a control signal to close off the corresponding shut-off valve 134 (e.g., 134a, 134b or 134c), thereby turning off the associated dopant source gas storage tank 132 (e.g., 132a, 132b or 132c). As a result, the safety issue caused by the releasing of the toxic dopant source gas to the atmosphere due to the leakage of the dopant source gas supply pipe 140 is prevented.

In some embodiments, the monitoring system 106 further includes a current meter 166 installed between the dopant source gas supply pipe 140 and the ground. The current meter 166 is operative to detect a current signal. In normal operation of the ion implantation system 100, the current detected by the current meter 166 is zero or under background noise. When an event such as arcing or discharging due to the leakage of the dopant source gas supply pipe 140 occurs, the current meter 166 detects a current signal and trigger the control unit 108 to close off the corresponding shut-off valve 134 (e.g., 134a, 134b or 134c). The current meter 166 is optional and is omitted in some embodiments of the present disclosure.

Figure 3:
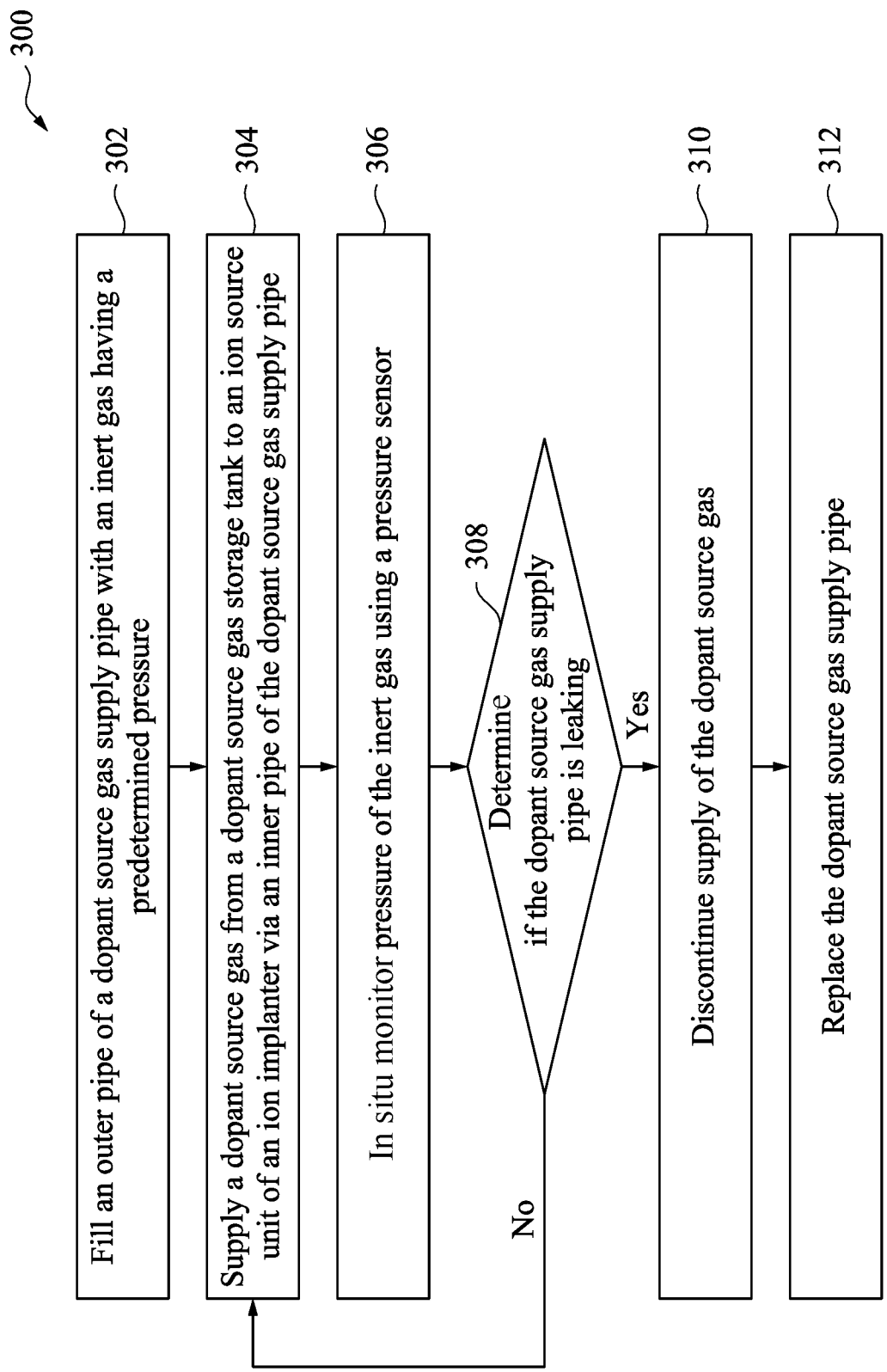
FIG. 3 is a flowchart of a method for delivering a dopant source gas to an ion implanter of the ion implantation system, in accordance with some embodiments.

FIG. 3 is flowchart of a method 300 of delivering a dopant source gas to an ion implanter 102 of an ion implantation system 100 of FIG. 1, in accordance with some embodiments. One or more components of the ion implantation system 100 is/are controlled by the control unit 108 (FIG. 5) to perform the method 300.

The method 300 includes operation 302, in which an outer pipe 146 of a dopant source gas supply pipe 140 is filled with an inert gas (e.g., nitrogen) having a predetermined pressure.

In operation 304 of the method 300, a dopant source gas is supplied from a dopant source gas storage tank 132 (e.g., 132a, 132b, 132c) to an ion source unit 120 of the ion implanter 102. The dopant source gas from the dopant source gas storage tank 132 which resides at a ground potential is delivered to the ion source unit 120 of the ion implanter 102 which operates at a higher potential (e.g., about 90 kV) via an inner pipe 144 of the dopant source gas supply pipe 140.

In operation 306 of the method 300, the pressure of the inert gas contained in the outer pipe 146 of the dopant source gas supply pipe 140 is monitored in situ using a pressure sensor 164 as the dopant source gas flows from the dopant source gas storage tank 132 to the ion source unit 120 of the ion implanter 102.

In operation 308 of the method 300, leakage of the dopant source gas supply pipe 140 is determined. In instances where the dopant source gas supply pipe 140 is leaking, the pressure level of the inert gas in the outer pipe 146 of the dopant source gas supply pipe 140 decreases. The pressure value of the inert gas in the outer pipe 146 of the dopant source gas supply pipe 140 is sent to the control unit 108 and is compared with a predetermined pressure threshold. Once the pressure of the inert gas falls below the predetermined pressure threshold, an alarm is triggered to report the leakage of the dopant source gas supply pipe 140. Otherwise, dopant source gas will continue to be transported through the dopant source gas supply pipe 140 towards the ion source unit 120 of the ion implanter 102.

If the determination is made that leakage associated with the dopant source gas supply pipe 140 exists, the method 300 proceeds to operation 310. In operation 310, in response to the alarm indicating the leakage of the dopant source gas supply pipe 140 occurs, the supply of the dopant source gas is discontinued. For example, once the control unit 108 determines that the dopant source gas supply pipe 140 leaks, the control unit 108 sends a control signal to a corresponding shut-off valve 134 (e.g., 134a, 134b or 134c). The corresponding shut-off valve 134 (e.g., 134a, 134b or 134c) is closed to stop the gas flow from the associated dopant source gas storage tank 132 (e.g., 132a, 132b or 132c) to the ion source unit 120 of the ion implanter 102.

In operation 312, a factory personnel is informed and the broken dopant source gas supply pipe 140 is replaced.

Figure 4:
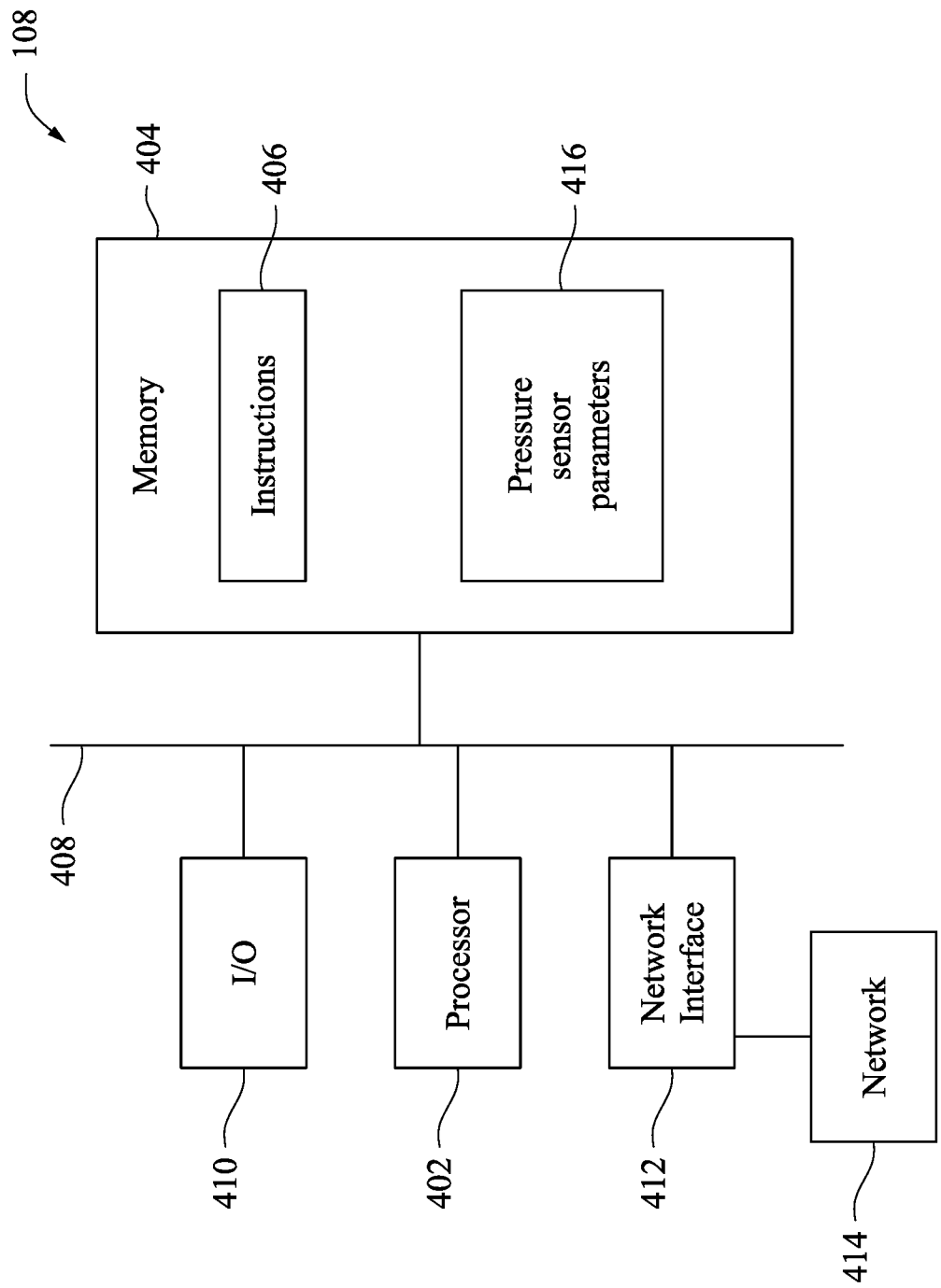
FIG. 4 is a block diagram of a control unit for controlling operations of the ion implantation system.

FIG. 4 is a block diagram of the control unit 108 for controlling operations of the ion implantation system 100, in accordance with some embodiments.

In some embodiments, the control unit 108 is a general purpose computing device including a hardware processor 402 and a non-transitory, computer readable storage medium 404 encoded with, i.e., storing, the computer program code, i.e., a set of executable instructions 406. The computer readable storage medium 404 is also encoded with instructions 406 for interfacing with components of the ion implantation system 100, e.g., ion implanter 102 and dopant source gas supply system 104. The processor 402 is electrically coupled to the computer readable storage medium 404 via a bus 408. The processor 402 is also electrically coupled to an I/O interface 410 by bus 408. A network interface 412 is also electrically connected to the processor 402 via a bus 408. The network interface 412 is connected to a network 414, so that processor 402 and computer readable storage medium 404 are capable of connecting to external elements via network 414. The processor 402 is configured to execute the computer program instructions 406 encoded in the computer readable storage medium 404 in order to cause the control unit 108 to be usable for performing a portion or all of the operations as described in the method 300.

In some embodiments, the processor 402 is a central processing unit (CPU), a multi-processor, a distributed processing system, an application specific integrated circuit (ASIC), and/or a suitable processing unit.

In some embodiments, the computer readable storage medium 404 is an electronic, magnetic, optical, electromagnetic, infrared, and/or a semiconductor system (or apparatus or device). For example, the computer readable storage medium 404 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 404 includes a compact disk-read only memory (CD-ROM), a compact disk-read/write (CD-R/W), and/or a digital video disc (DVD).

In some embodiments, the computer readable storage medium 404 stores the computer program instructions 406 configured to cause the control unit 108 to perform a portion or all of the method 300. In some embodiments, the computer readable storage medium 404 also stores information needed for performing the method 300 as well as information generated during the performance of the method 300, such as pressure sensor parameters 416 and/or a set of executable instructions to perform one or more operations of the method 300.

In some embodiments, the computer readable storage medium 404 stores computer program instructions 406 for interfacing with the ion implantation system 100. The computer program instructions 406 enable the processor 402 to generate operating instructions readable components in ion implanter 102, the dopant source gas supply system 104 and the monitoring system 106 to effectively implement the operations as described with respect to the ion implanter 102, the dopant source gas supply system 104 and the monitoring system 106.

The control unit 108 includes input/output (I/O) interface 410. The I/O interface 410 is coupled to external circuitry. In some embodiments, the I/O interface 410 includes a keyboard, keypad, mouse, trackball, trackpad, and/or cursor direction keys for communicating information and commands to the processor 402.

The control unit 108 also includes network interface 412 coupled to the processor 402. The network interface 412 allows the control unit 108 to communicate with the network 414, to which one or more other computer systems are connected. The network interface 412 includes wireless network interfaces such as BLUETOOTH, WIFI, WIMAX, GPRS, or WCDMA; or wired network interface such as ETHERNET, USB, or IEEE-1394. In some embodiments, the operations as described with respect to the method 300 are implemented in two or more control units 108, and information such as refracted light intensities and one or more threshold intensity values, are exchanged between different control units 108 via network 414.

The advantages and features of the disclosure are further appreciable through the following example embodiments:

One aspect of this description relates to an ion implantation system. In some embodiments, an ion implantation system includes an ion implanter containing an ion source unit and a dopant source gas supply system. The dopant source gas supply system includes a dopant source gas storage tank inside a gas box container located remotely to the ion implanter, and a dopant source gas supply pipe configured to supply a dopant source gas from the dopant source gas storage tank to the ion source unit. The dopant source gas supply pipe includes an inner pipe, an outer pipe enclosing the inner pipe, a first pipe adaptor coupled to a first end of each of the inner pipe and the outer pipe, and a second pipe adaptor coupled to a second end of each of the inner pipe and the outer pipe opposite the first end. The first pipe adaptor connects the inner pipe to the dopant source gas storage tank and the second pipe adaptor connects the inner pipe to the ion source unit. In some embodiments, each of the inner pipe and the outer pipe includes an electrically insulating material. In some embodiments, each of the inner pipe and the outer pipe includes polytetrafluoroethylene, polypropylene, polyethylene, or polyvinyl chloride. In some embodiments, each of the first pipe adaptor and the second pipe adaptor includes an electrically conductive material. In some embodiments, each of the first pipe adaptor and the second pipe adaptor includes stainless steel. In some embodiments, the first pipe adaptor includes an inner cap sealing the first end of the inner pipe and an outer cap sealing the first end of the outer pipe. In some embodiments, the first pipe adaptor further includes a first port in fluidically communication with the inner pipe and a second port in fluidically communication with the outer pipe. In some embodiments, the first port extends through the inner cap and the outer cap of the first pipe adaptor, and the second port extends through the outer cap of the first pipe adaptor. In some embodiments, the second pipe adaptor includes an inner cap sealing the second end of the inner pipe and an outer cap sealing the second end of the outer pipe. In some embodiments, the second pipe adaptor further includes a third port in fluidically communication with the inner pipe. In some embodiments, the third port extends through the inner cap and the outer cap of the second pipe adaptor.

Another aspect of this description relates to an ion implantation system. In some embodiments, an ion implantation system includes an ion implanter inside a housing and containing an ion source unit. The ion implantation system further includes a dopant source gas storage tank inside a gas box container located outside of the housing. The ion implantation system further includes a dopant source gas supply pipe configured to supply a dopant source gas from the dopant source gas storage tank to the ion source unit. The dopant source gas supply pipe includes an inner pipe configured to carry the dopant source gas, an outer pipe enclosing the inner pipe and configured to carry an inert gas, a first pipe adaptor coupled to a first end of each of the inner pipe and the outer pipe and connecting the inner pipe to the dopant source gas storage tank, and a second pipe adaptor coupled to a second end of each of the inner pipe and the outer pipe opposite the first end and connecting the inner pipe to the ion source unit. The ion implantation system further includes a pressure sensor configured to measure a pressure level of the inert gas in the outer pipe. In some embodiments, each of the inner pipe and the outer pipe includes an electrically insulating material. In some embodiments, the first pipe adaptor includes an inner cap sealing the first end of the inner pipe, an outer cap sealing the first end of the outer pipe, a first inlet port extending through the inner cap and the outer cap to be in fluidically communication with the inner pipe, and a second inlet port extending through the outer cap to be in fluidically communication with the outer pipe. In some embodiments, the second pipe adaptor comprises an inner cap sealing the second end of the inner pipe, an outer cap sealing the second end of the outer pipe, and an outlet port extending through the inner cap and the outer cap to be in fluidically communication with the inner pipe. In some embodiments, each of the first pipe adaptor and the second pipe adaptor includes stainless steel. In some embodiments, each of the inner pipe and the outer pipe includes a plurality of grooves on an outer surface thereof. In some embodiments, the gas box container is at a ground potential.

Still another aspect of this description relates to a method of using an ion implantation system. In some embodiments, a method includes filling an outer pipe of a dopant source gas supply pipe with an inert gas having a predetermined pressure. The method further includes supplying a dopant source gas from a dopant source gas storage tank to an ion source unit of an ion implanter via an inner pipe of the dopant source gas supply pipe that is surrounded by the outer pipe. The ion implanter is disposed in a housing, the dopant source gas storage tank is disposed in a gas box container located outside of the housing. The method further includes in situ monitoring a pressure of the inert gas. The method further includes determining leakage of the dopant source gas supply pipe if the pressure of the inert gas is below a predetermined threshold. In some embodiments, the method further includes stopping the supplying of the dopant source gas by closing a shut-off valve connected to the dopant source gas storage tank.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An ion implantation system, comprising:
    an ion implanter comprising an ion source unit; and
    a dopant source gas supply system comprising:
        a dopant source gas storage tank inside a gas box container located remotely to the ion implanter; and
        a dopant source gas supply pipe configured to supply a dopant source gas from the dopant source gas storage tank to the ion source unit, the dopant source gas supply pipe comprising:
            an inner pipe;
            an outer pipe enclosing the inner pipe;
            a first pipe adaptor coupled to a first end of each of the inner pipe and the outer pipe for connecting the inner pipe to the dopant source gas storage tank, the first pipe adaptor including a first inner cap and a first outer cap spaced from the first inner cap by a first gap, the first inner cap having a dimension greater than the first end of the inner pipe to enclose the first end of the inner pipe therein, the first outer cap having a dimension greater than the first end of the outer pipe to enclose the first end of the outer pipe therein; and
            a second pipe adaptor coupled to a second end of each of the inner pipe and the outer pipe opposite the first end for connecting the inner pipe to the ion source unit, the second pipe adaptor including a second inner cap and a second outer cap spaced from the second inner cap by a second gap, the second inner cap having a dimension greater than the second end of the inner pipe to enclose the second end of the inner pipe therein, the second outer cap having a dimension greater than the second end of the outer pipe to enclose the second end of the outer pipe therein.

2. The ion implantation system of claim 1, wherein each of the inner pipe and the outer pipe comprises an electrically insulating material.

3. The ion implantation system of claim 2, wherein each of the inner pipe and the outer pipe comprises polytetrafluoroethylene, polypropylene, polyethylene, or polyvinyl chloride.

4. The ion implantation system of claim 1, wherein each of the first pipe adaptor and the second pipe adaptor comprises an electrically conductive material.

5. The ion implantation system of claim 4, wherein each of the first pipe adaptor and the second pipe adaptor comprises stainless steel.

6. The ion implantation system of claim 1, wherein the first pipe adaptor further comprises a first port in fluidically communication with the inner pipe and a second port in fluidically communication with the outer pipe.

7. The ion implantation system of claim 6, wherein the first port extends through the first inner cap and the first outer cap of the first pipe adaptor, and the second port extends through the first outer cap of the first pipe adaptor.

8. The ion implantation system of claim 1, wherein the second pipe adaptor further comprises a third port in fluidically communication with the inner pipe.

9. The ion implantation system of claim 8, wherein the third port extends through the second inner cap and the second outer cap of the second pipe adaptor.

10. The ion implantation system of claim 1, further comprising a monitoring system configured to in situ monitor the leakage of the dopant source gas supply pipe.

11. The ion implantation system of claim 10, wherein the monitoring system comprises a pressure sensor for detecting a pressure level of the inert gas contained in the outer pipe of the dopant source gas supply pipe, and a current meter coupled to the dopant source gas supply pipe for detecting a leak current.

12. An ion implantation system, comprising:
    an ion implanter inside a housing, the ion implanter comprising an ion source unit;
    a dopant source gas storage tank inside a gas box container located outside of the housing;
    a dopant source gas supply pipe configured to supply a dopant source gas from the dopant source gas storage tank to the ion source unit, the dopant source gas supply pipe comprising:
        an inner pipe configured to carry the dopant source gas;
        an outer pipe enclosing the inner pipe and configured to carry an inert gas;
        a first pipe adaptor coupled to a first end of each of the inner pipe and the outer pipe, the first pipe adaptor connecting the inner pipe to the dopant source gas storage tank, the first pipe adaptor including a first inner cap and a first outer cap spaced from the first inner cap by a first gap, the first inner cap having a dimension greater than the first end of the inner pipe to enclose the first end of the inner pipe therein, the first outer cap having a dimension greater than the first end of the outer pipe to enclose the first end of the outer pipe therein; and
    a second pipe adaptor coupled to a second end of each of the inner pipe and the outer pipe opposite the first end, the second pipe adaptor connecting the inner pipe to the ion source unit, the second pipe adaptor including a second inner cap and a second outer cap spaced from the second inner cap by a second gap, the second inner cap having a dimension greater than the second end of the inner pipe to enclose the second end of the inner pipe therein, the second outer cap having a dimension greater than the second end of the outer pipe to enclose the second end of the outer pipe therein; and a pressure sensor configured to measure a pressure level of the inert gas in the outer pipe .

13. The ion implantation system of claim 12, wherein each of the inner pipe and the outer pipe comprises an electrically insulating material.

14. The ion implantation system of claim 12, wherein the first pipe adaptor comprises an inner cap sealing the first end of the inner pipe, an outer cap sealing the first end of the outer pipe, a first inlet port extending through the inner cap and the outer cap to be in fluidically communication with the inner pipe, and a second inlet port extending through the outer cap to be in fluidically communication with the outer pipe.

15. The ion implantation system of claim 12, wherein the second pipe adaptor comprises an inner cap sealing the second end of the inner pipe, an outer cap sealing the second end of the outer pipe, and an outlet port extending through the inner cap and the outer cap to be in fluidically communication with the inner pipe.

16. The ion implantation system of claim 12, wherein each of the first pipe adaptor and the second pipe adaptor comprises stainless steel.

17. The ion implantation system of claim 12, wherein each of the inner pipe and the outer pipe comprises a plurality of grooves on an outer surface thereof.

18. The ion implantation system of claim 12, wherein the gas box container is at a ground potential.

19. A method for delivering a dopant source gas to the ion implantation system of claim 1, comprising:
   filling the outer pipe of the dopant source gas supply pipe of claim 1 an inert gas having a predetermined pressure;
   supplying the dopant source gas from the dopant source gas storage tank to the ion source unit of the ion implanter via the inner pipe of the dopant source gas supply pipe that is surrounded by the outer pipe;
   in situ monitoring a pressure of the inert gas; and
   determining a leakage of the dopant source gas supply pipe if the pressure of the inert gas is below a predetermined threshold.

20. The method of claim 19, further comprising stopping the supplying of the dopant source gas by closing a shut-off valve connected to the dopant source gas storage tank.

* * * * *